(12) United States Patent
Cheng et al.

(10) Patent No.: US 11,658,262 B1
(45) Date of Patent: May 23, 2023

(54) METHOD FOR MANUFACTURING LIGHT EMITTING DEVICE

(71) Applicant: Innolux Corporation, Miao-Li County (TW)

(72) Inventors: Kai Cheng, Miao-Li County (TW); Tsau-Hua Hsieh, Miao-Li County (TW); Jian-Jung Shih, Miao-Li County (TW); Fang-Ying Lin, Miao-Li County (TW); Hui-Chieh Wang, Miao-Li County (TW); Wan-Ling Huang, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 122 days.

(21) Appl. No.: 16/853,723

(22) Filed: Apr. 20, 2020

Related U.S. Application Data

(60) Provisional application No. 62/873,191, filed on Jul. 12, 2019.

(51) Int. Cl.
*H01L 33/00* (2010.01)
*H01L 25/075* (2006.01)

(52) U.S. Cl.
CPC ...... *H01L 33/0095* (2013.01); *H01L 25/0753* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 10,984,708 B1* | 4/2021 | Pourchet | H05B 45/50 |
| 2017/0263811 A1 | 9/2017 | Zou et al. | |
| 2019/0097081 A1* | 3/2019 | Liao | H01L 33/0095 |
| 2019/0252232 A1* | 8/2019 | Chen | H01L 27/153 |

\* cited by examiner

*Primary Examiner* — Ratisha Mehta
(74) *Attorney, Agent, or Firm* — JCIPRNET

(57) ABSTRACT

A method for manufacturing a light emitting device is provided. The method for manufacturing the light emitting device includes: providing a substrate with light emitting units disposed thereon; attaching the light emitting units to a carrier; removing the substrate; and transferring a portion of the light emitting units from the carrier to a driving substrate.

17 Claims, 4 Drawing Sheets

METHOD FOR MANUFACTURING LIGHT EMITTING DEVICE

CROSS-REFERENCE TO RELATED APPLICATION

This application claims the priority benefit of U.S. provisional application Ser. No. 62/873,191, filed on Jul. 12, 2019. The entirety of the above-mentioned patent application is hereby incorporated by reference herein and made a part of this specification.

BACKGROUND

Technical Field

The disclosure relates to a method for manufacturing an electronic device, and in particular, to a method for manufacturing a light emitting device.

Description of Related Art

Light emitting diode (LED) transfer is a key step in the method for manufacturing light emitting devices. Several methods have been proposed for transferring LEDs between different substrates. However, due to the limited information on LED transfer technology, knowledge of LED mass transfer, selective transfer or repair transfer is insufficient or incomplete.

SUMMARY

The disclosure provides a method for manufacturing a light emitting device, which is suitable for LED mass transfer, selective transfer, or repair transfer.

According to an embodiment of the disclosure, a method for manufacturing a light emitting device includes: providing a substrate with light emitting units disposed thereon; attaching the light emitting units to a carrier; removing the substrate; and transferring a portion of the light emitting units from the carrier to a driving substrate.

Based on the above, in one or more embodiments of the disclosure, the method for manufacturing the light emitting device describes LED transfer technology and is suitable for LED mass transfer, selective transfer, or repair transfer.

In order to make the above features or advantages of the disclosure more obvious, the following embodiment is described in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
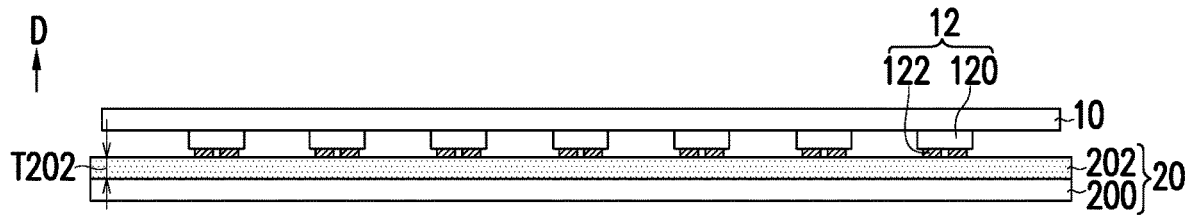
FIG. 1A to FIG. 1D are flowcharts of a method for manufacturing a light emitting device according to a first embodiment of the disclosure.

The disclosure may be understood by referring to the following detailed descriptions in conjunction with the accompanying drawings. It should be noted that in order for the reader to understand easily and for the simplicity of the drawings, multiple drawings in the disclosure only illustrate a portion of the light emitting device, and specific elements in the drawings are not drawn to scale. In addition, the number and size of each element in the drawings are only for illustration and are not intended to limit the scope of the disclosure.

Certain terms are used throughout the disclosure and the appended claims to refer to specific elements. Persons skilled in the art should understand that electronic equipment manufacturers may refer to the same elements using different names. The disclosure is not intended to distinguish between the elements with the same function but different names. In the following specification and claims, words such as "having" and "including" are open-ended words, which should be interpreted as the meaning of "including but not limited to . . . ".

Directional terms such as "up", "down", "front", "rear", "left", "right", etc., as mentioned in the disclosure only refer to directions with reference to the drawings. Therefore, the directional terms are only for illustration and are not intended to limit the disclosure. In the drawings, the drawings illustrate general characteristics of methods, structures, and/or materials used in specific embodiments. However, the drawings should not be construed to define or limit the scope or nature covered by the embodiments. For example, for clarity, the relative size, thickness, and location of each film layer, region, and/or structure may be reduced or enlarged.

It should be understood that when an element or film layer is referred to as being disposed "on" or "connected" to another element or film layer, the former may be directly on or directly connected to the other element or film layer or there may be an intervening element or film layer between the two (indirect case). In contrast, when an element is referred to as being "directly on" or "directly connected" to another element or film layer, there is no intervening element or film layer between the two.

The term "approximately", "around", "equal to", "equal", or "same" typically represents falling within a 20% range of a given value or range, or represents falling within a 10%, 5%, 3%, 2%, 1%, or 0.5% range of a given value or range.

In the disclosure, the same or similar elements will be given the same or similar reference numerals, and detailed descriptions thereof will be omitted. In addition, as long as the features in different embodiments do not violate the spirit of the disclosure and are not mutually conflicting, they may be mixed and used arbitrarily. Also, all simple equivalent changes and modifications made according to the specification or claims fall within the scope of the disclosure. In addition, terms such as "first", "second", etc. mentioned in the specification or claims are only used to name discrete elements or to distinguish different embodiments or ranges, but not to limit the upper limit or lower limit of the number of elements and the manufacturing sequence or configurational sequence of the elements.

The light emitting device of the disclosure may include a display device, an antenna device, a sensing device, or a splicing device, but is not limited thereto. In one example, the light emitting device may be a backlight module of a display device, but not limited thereto. The light emitting device may be a bendable or flexible device. The light emitting device may include, for example, at least one light emitting unit. The light emitting unit may include a light emitting diode (LED). The LED may include, for example, an organic LED (OLED), a mini LED, a micro LED, or a quantum dot LED (abbreviated as QLED or QDLED), fluorescence, phosphor, other suitable materials, or a combination thereof, but is not limited thereto.

FIG. 1A to FIG. 1D are flowcharts of a method for manufacturing a light emitting device according to a first embodiment of the disclosure. Referring to FIG. 1A, a substrate 10 with light emitting units 12 disposed thereon is provided. In some embodiments, the substrate 10 is a growth substrate, and the light emitting units 12 may be formed on the substrate 10 through an epitaxy process, but not limited thereto. The growth substrate may include a sapphire wafer or other substrate suitable for fabricating the light emitting units 12. In other embodiments, the substrate 10 is a carrier substrate, and the light emitting units 12 may be formed on or disposed on the substrate 10 through a transfer process, but not limited thereto. The carrier substrate (also referred to as "a carrier") may include a rigid substrate for carrying the light emitting units 12, but not limited thereto. In some embodiments, the carrier substrate may further include an adhesive layer (not shown) to allow the light emitting units 12 to be attached to the rigid substrate. The adhesive layer may include one or more organic material layers. A material of the one or more organic material layers may include acrylic, silicone, photo resin, resin, or petroleum series material, but not limited thereto.

At least one of the light emitting units 12 may include a light emitting diode (LED) 120. The at least one of the light emitting units 12 may further include a plurality of pads 122 (e.g., a pair of pads 122) disposed on the LED 120, wherein the LED 120 is located between the plurality of pads 122 and the substrate 10, and the LED 120 can be lit by receiving external signals via the plurality of pads 122.

Then, the light emitting units 12 are attached to a carrier 20. In some embodiments, the light emitting units 12 are attached to the carrier 20 through a lamination process, wherein a lamination pressure thereof is in a range from 0.1M Pa to 3M Pa (i.e., $0.1 \times 10^6$ Pa≤lamination pressure≤$3 \times 10^6$ Pa), and a lamination temperature thereof is in a range from room temperature to 300° C. (i.e., room temperature≤lamination temperature≤300° C.). The room temperature may be around 25° C.

In some embodiments, the carrier 20 may include a rigid substrate 200 and an adhesive layer 202 disposed on the rigid substrate 200. The rigid substrate 200 has stiffness to maintain a flat surface for carrying the light emitting units 12 during the transfer of the light emitting units 12. For example, the rigid substrate 200 includes a glass substrate, but not limited thereto. The adhesive layer 202 is adapted to allow the light emitting units 12 to be attached to the rigid substrate 200, and when the adhesive layer 202 is exposed to light, heat, or mechanical force, the adhesive ability or sticky force of the adhesive layer 202 may be reduced or the adhesive layer 202 may be evaporated. For example, the adhesive layer 202 may include one or more organic material layers. A material of the one or more organic material layers may include acrylic, silicone, photo resin, resin, petroleum series material, other suitable materials, and a combination thereof, but not limited thereto. The adhesive layer 202 may be a single layer or multiple layers. A thickness T202 of the adhesive layer 202 may be in a range from 0.1 μm to 100 μm (i.e., 0.1 μm≤T202≤100 μm), but not limited thereto. The thickness T202 of the adhesive layer 202 may refer to the maximum thickness of the cross-sectional area of the adhesive layer 202. In some alternative embodiments, the adhesive layer 202 may include a UV tape or a thermal tape, but not limited thereto.

The light emitting units 12 may be attached to the adhesive layer 202 after the light emitting units 12 are attached to the carrier 20. In some embodiments, the light emitting units 12 may contact the adhesive layer 202 and may not be immersed in the adhesive layer 202, as shown in FIG. 1A. However, whether the light emitting units 12 are immersed in the adhesive layer 202 or not is not limited in the disclosure, and the depths to which the light emitting units 12 are immersed in the adhesive layer 202 may depend on factors such as process conditions (e.g., lamination force) and the material property. FIG. 1E is a schematic diagram showing an alternative step that can replace the step shown in FIG. 1A. As shown in FIG. 1E, in some alternative embodiments, the light emitting units 12 may be immersed in the adhesive layer 202, and the light emitting units 12 may or may not contact the rigid substrate 200.

After the light emitting units 12 are attached to the carrier 20, the substrate 10 may be removed. The upper half of FIG. 1B illustrates the situation where the substrate 10 is removed and the carrier 20 attached with the light emitting units 12 is turned over.

In some embodiments, the substrate 10 is removed from the light emitting units 12 through a light illumination process, an etching process, a heating process, a mechanical force application process, or a combination thereof. Take the light illumination process for example, the substrate 10 may be illuminated by an energy beam (not shown). The energy beam may be a laser beam, but not limited thereto. In some embodiments, a wavelength of the energy beam may be in a range from 200 nm to 1064 nm (i.e., 200 nm≤wavelength≤1064 nm), but not limited thereto. For example, the wavelength of the energy beam may be 266 nm, 308 nm, 355 nm, 532 nm, or 1064 nm, but not limited thereto.

In the case where the substrate 10 is a growth substrate (such as a sapphire substrate) and the light emitting units 12 are grown on the growth substrate, a chemical reaction generated by the irradiation of the energy beam causes nitrogen gas to be generated at an interface between the substrate 10 and the light emitting units 12, thereby separating the substrate 10 from the light emitting units 12. In the case where the substrate 10 is a carrier substrate and the light emitting units 12 are attached to an adhesive layer (not shown) of the carrier substrate, a chemical reaction generated by the irradiation of the energy beam causes the adhesive layer of the carrier substrate to reduce its adhesive ability or causes the adhesive layer of the carrier substrate to evaporate, thereby separating the substrate 10 from the light emitting units 12. Under both circumstances, the energy beam illuminates the substrate 10 from a side of the substrate 10 opposite to the carrier 20 to minimize the effect of the energy beam on the adhesive layer 202 of the carrier 20, and the light emitting units 12 are still attached to the carrier 20 after the irradiation of the energy beam. Moreover, the substrate 10 may be separated from the light emitting units 12 by illuminating the entire substrate 10 with the energy beam or by illuminating partial regions (e.g., regions of the substrate 10 that are overlapped with the light emitting units 12 in a normal direction D of the substrate 10) of the substrate 10 with the energy beam.

Figure 1B:
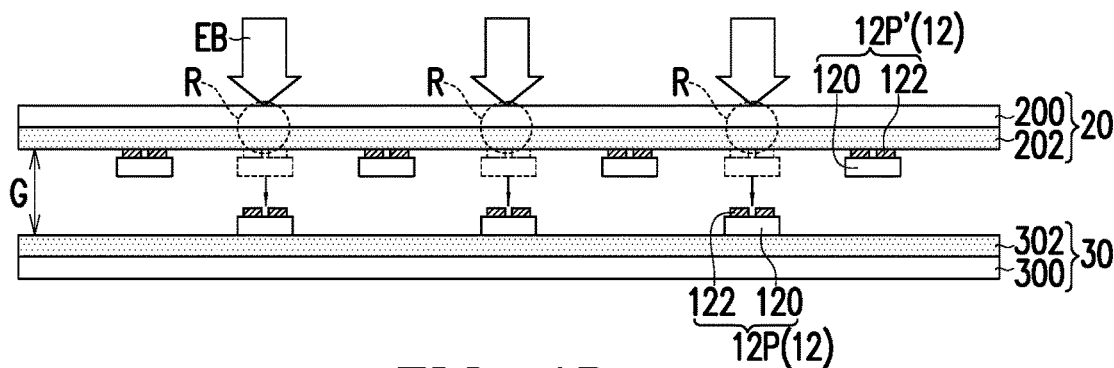
Figure 1C:
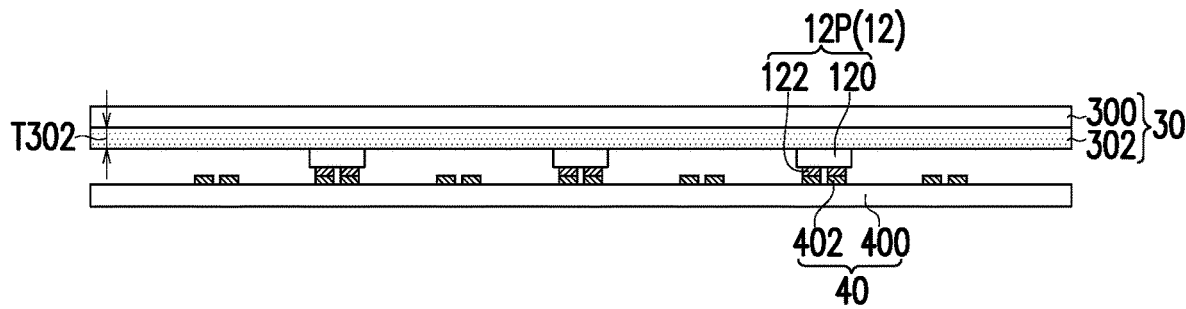
Figure 1D:
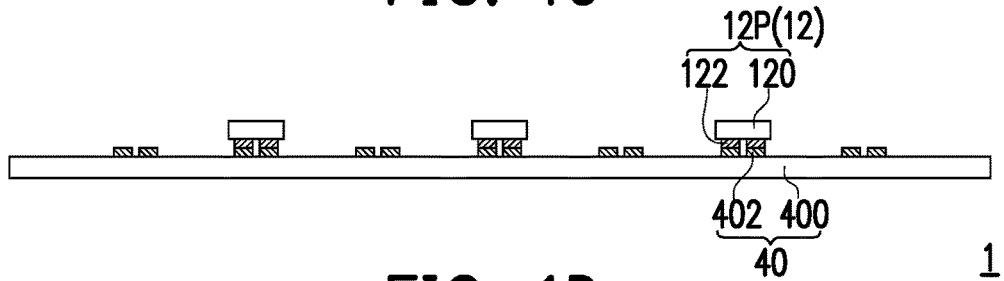
Figure 1E:
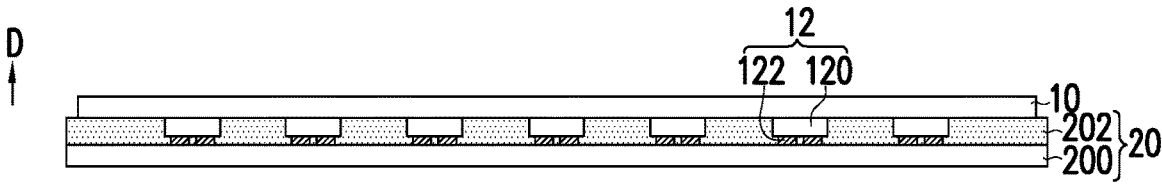
FIG. 1E is a schematic diagram showing an alternative step that can replace the step shown in FIG. 1A.

After the substrate 10 is removed, a portion of the light emitting units 12 (e.g., the light emitting units 12P among the light emitting units 12) are transferred from the carrier 20 to a driving substrate 40, as shown in FIG. 1B to FIG. 1D.

FIG. 1B illustrates a step of a selective transfer. The selective transfer refers to a case where a portion of the light emitting units 12 (e.g., the light emitting units 12P among the light emitting units 12) are transferred, and the other portion of the light emitting units 12 (e.g., the light emitting units 12P' among the light emitting units 12) are not transferred.

Referring to FIG. 1B, the portion of the light emitting units 12 (e.g., the light emitting units 12P among the light emitting units 12) are transferred from the carrier 20 to another carrier (e.g., a carrier 30). In some embodiments, the portion of the light emitting units 12 (e.g., the light emitting units 12P among the light emitting units 12) are transferred from the carrier 20 to the carrier 30 through steps of: turning over the carrier 20 attached with the light emitting units 12 and the light emitting units 12 faces the carrier 30; and illuminating regions R of the carrier 20 overlapped with the light emitting units 12P by an energy beam EB. For the related description of the energy beam EB and the chemical reaction generated at the adhesive layer 202 of the carrier 20 due to the irradiation of the energy beam EB, please refer to the above, and it will not be repeated here.

After the irradiation of the energy beam EB, the adhesive ability or sticky of the adhesive layer 202 is reduced or the adhesive layer 202 is evaporated in regions R subjected to the energy beam EB, and the light emitting units 12P falls on the carrier 30 by gravity. In some embodiments, a gap G between the carrier 20 and the carrier 30 when the carrier 20 is illuminated by the energy beam EB may be in a range from 1 µm to 300 µm (i.e., 1 µm≤G≤300 µm) to improve the accuracy or success rate of LED transfer, such as 50 µm, 100 µm or 200 µm. The gap G between the carrier 20 and the carrier 30 refers to the distance between the outermost surface of the carrier 20 facing the carrier 30 and the outermost surface of the carrier 30 facing the carrier 20 along a stacking direction of the carrier 20 and the carrier 30.

In some embodiments, the carrier 30 may include a rigid substrate 300 and an adhesive layer 302 disposed on the rigid substrate 300, but not limited thereto. For the related description of the rigid substrate 300 and the adhesive layer 302, please refer to the rigid substrate 200 and the adhesive layer 202 above, and it will not be repeated here. In some embodiments, the rigid substrate 300 and the rigid substrate 200 may have the same or different properties, such as material, thickness, light transmittance, hardness, or the like. In some embodiments, the adhesive layer 302 and the adhesive layer 202 may have the same or different properties, such as material, thickness, viscosity, number of film layers, or the like. In some embodiments, a thickness T302 of the adhesive layer 302 may be in a range from 0.1 µm to 100 µm (i.e., 0.1 µm≤T302≤100 µm, such as 1 µm, 5 µm, 10 µm, or 50 µm), and the thickness T302 of the adhesive layer 302 may be the same as or different from the thickness T202 of the adhesive layer 202. The thickness T302 of the adhesive layer 302 refers to the maximum thickness of the cross-sectional area of the adhesive layer 302.

After the portion of the light emitting units 12 (e.g., the light emitting units 12P among the light emitting units 12) are transferred from the carrier 20 to the carrier 30, the light emitting units 12P are disposed on the adhesive layer 302, and the LEDs 120 of the light emitting units 12P are located between the plurality of pads 122 and the adhesive layer 302.

The adhesive layer 302 may help the light emitting units 12P attach to the rigid substrate 300 with acceptable shift or twist. Therefore, in the step of FIG. 1B, the selective transfer can also be changed to a mass transfer or a repair transfer as needed.

Referring to FIG. 1C, after the light emitting units 12P are transferred to the carrier 30, the light emitting units 12P are transferred from the carrier 30 to the driving substrate 40. In some embodiments, the light emitting units 12P are transferred from the carrier 30 to the driving substrate 40 through steps of: bonding the pads 122 of the light emitting units 12P to pads 402 of the driving substrate 40; and removing the carrier 30. In some embodiments, the carrier 30 attached with the light emitting units 12P is turned over and the pads 122 of the light emitting units 12P faces the pads 402 of the driving substrate 40, and the light emitting units 12P and the pads 402 are located between the carrier 30 and the circuit board 400 of the driving substrate 40. The circuit board 400 may be a printed circuit board (PCB), but not limited thereto. Then, the pads 122 of the light emitting units 12P are aligned and in contacted with the pads 402 of the driving substrate 40. After the pads 122 of the light emitting units 12P are in contacted with the pads 402 of the driving substrate 40, an eutectic bonding or a reflow process may be performed and the pads 122 of the light emitting units 12P are connected to the pads 402 of the driving substrate 40.

After the pads 122 of the light emitting units 12P are connected to the pads 402 of the driving substrate 40, the carrier 30 may be removed by illuminating the carrier 30 by an energy beam (not shown). For the related description of the energy beam and the chemical reaction generated at the adhesive layer 302 of the carrier 30 due to the irradiation of the energy beam, please refer to the above, and it will not be repeated here.

After the carrier 30 is removed from the light emitting units 12P, a light emitting device 1 is manufactured, as shown in FIG. 1D.

In the embodiment shown in FIGS. 1A to 1D, the light emitting units 12P are bonded to the driving substrate 40 through the transfer processes (e.g. one mass transfer process shown in FIG. 1A, one selective transfer process shown in FIG. 1B and one mass transfer process shown in FIG. 1C). With the three transfer processes, the light emitting units 12P to be transferred to the driving substrate 40 can be picked up from the substrate 10 and the pads 122 of the light emitting units 12P can be turned to the direction where the pads 402 of the driving substrate 40 can be joined, which facilitates the bonding of the pads 122 of the light emitting units 12P and the pads 402 of the driving substrate 40. Moreover, because the accuracy or success rate of LED transfer is/are improved in the three transfer processes, the yield of the method for manufacturing the light emitting device 1 and the reliability of the light emitting device 1 can be improved.

In some embodiments, the light emitting units 12 (including the light emitting units 12P and the light emitting units 12P') may emit light with the same color. For example, the light emitting units 12 are red light emitting units, green light emitting units, or blue light emitting units. After the light emitting units of a first color are transferred to the driving substrate 40 through the steps shown in FIGS. 1A to 1D, the light emitting units of a second color or multiple colors may be transferred to the driving substrate 40 by performing the steps shown in FIGS. 1A to 1D once or multiple times.

According to different requirements, in addition to the steps shown in FIGS. 1A to 1D, the manufacturing of the light emitting device 1 may also include other additional steps. For example, a step of attaching the circuit board 400 of the driving substrate 40 to other circuits (not shown) after the required transfer processes are completed, but not limited thereto.

Figure 2A:
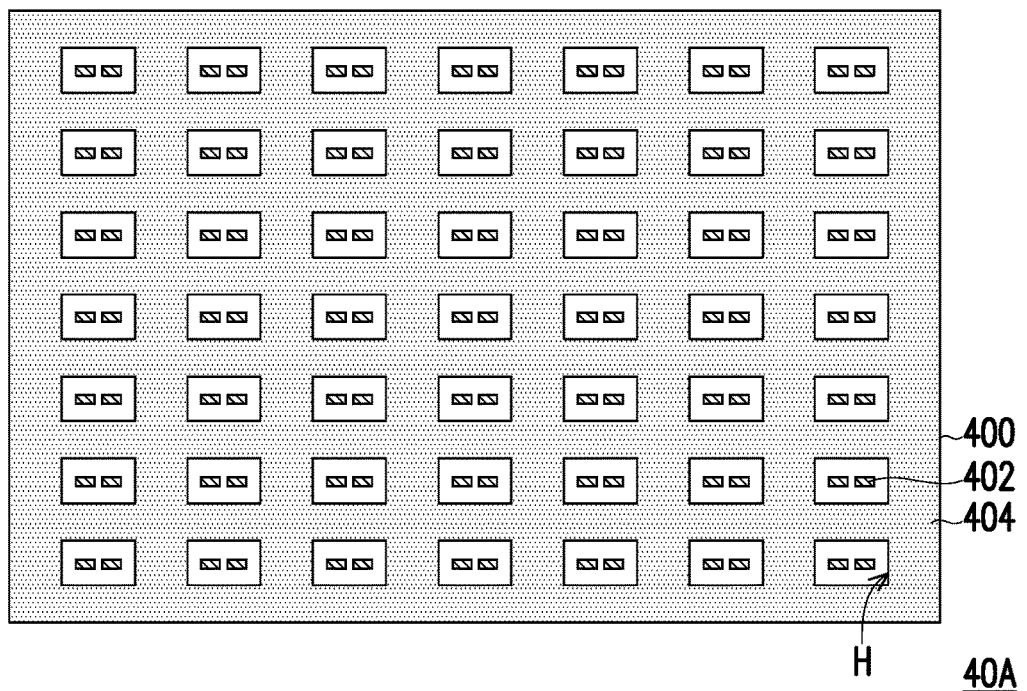
FIG. 2A to FIG. 2C are flowcharts of a method for manufacturing a light emitting device according to a second embodiment of the disclosure.
Figure 2B:
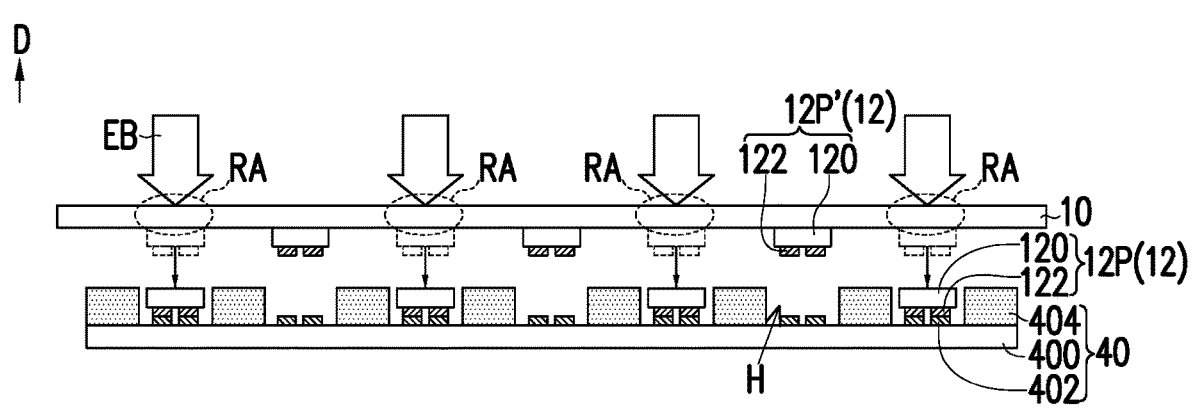
Figure 2C:
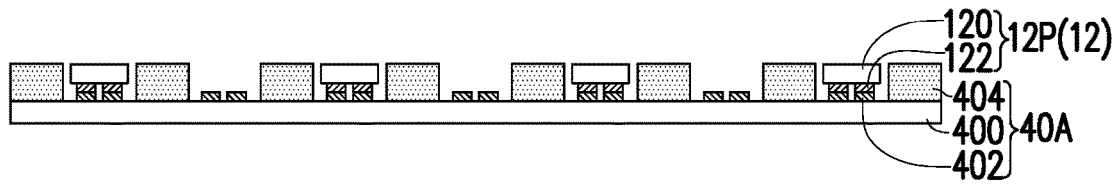

FIG. 2A to FIG. 2C are flowcharts of a method for manufacturing a light emitting device according to a second embodiment of the disclosure, wherein FIG. 2A is a schematic top view, and FIGS. 2B and 2C are schematic cross-sectional views.

Referring to FIG. 2A, a driving substrate 40A is provided. The driving substrate 40A may further include a pixel defining layer 404 in addition to the circuit board 400 and the pads 402. The pixel defining layer 404 is disposed on the circuit board 400, and the pixel defining layer 404 includes holes H for accommodating the light emitting units to be transferred to the driving substrate 40A. In some embodiments, as shown in FIG. 2A, the hole H may be disposed with a pair of pads 402 to be bonded with the pads 122 of one light emitting unit. The design parameters (e.g., the pitch/shape/size/arrangement of the holes H) of the holes H may be changed as required and therefore are not limited to those shown in FIG. 2A. For example, in some embodiments, the shape of the holes H may be circular, triangular, other polygon, or other suitable shape.

In some embodiments, a material of the pixel defining layer 404 may include an opaque insulating material to properly shield the elements located underneath from being seen by the user or reduce reflections. A material of the opaque insulating material may include acrylic, silicone, resin, or photo resin, and the material may be mixed with dyes to reduce light transmittance, but not limited thereto. In some embodiments, the pixel defining layer 404 may be formed on the circuit board 400 through a pattern process. The pattern process may include a spin coating process, a slit coating process, a printing process, or any other lithography processes.

Referring to FIG. 2B, the substrate 10 provided with the light emitting units 12 is located on the driving substrate 40A, and the light emitting units 12 face the driving substrate 40A. The pads 122 of the light emitting units 12 are aligned with the pads 402 of the driving substrate 40A. Then the light emitting units 12P are transferred to the driving substrate 40A through a selective transfer process. For example, regions RA of the substrate 10 overlapped with the light emitting units 12P in the normal direction D of the substrate 10 are illuminated by the energy beam EB, and the light emitting units 12P are separated from the substrate 10 and fall on the driving substrate 40A. For the related description of the energy beam EB and the chemical reaction generated at the substrate 10 due to the irradiation of the energy beam EB, please refer to the above, and it will not be repeated here.

Referring to FIG. 2C, after the light emitting units 12P are transferred from the substrate 10 to the driving substrate 40A, an eutectic bonding or a reflow process may be performed and the pads 122 of the light emitting units 12P are connected to the pads 402 of the driving substrate 40A. In some embodiments, a substrate (not shown) may press down the light emitting units 12P during the eutectic bonding, but not limited thereto.

After the pads 122 of the light emitting units 12P are connected to the pads 402 of the driving substrate 40A, a light emitting device 1A is manufactured, as shown in FIG. 2C.

In the embodiment shown in FIGS. 2A to 2C, the holes H of the pixel defining layer 404 can limit the regions where the light emitting units 12P fall and thus improves the accuracy of the LED transfer. Moreover, side walls of the holes H can support the light emitting units 12P, and thus reduce the poor contact due to LED tilting or improve success rate of the LED transfer. Therefore, the light emitting units 12P may be bonded to the driving substrate 40A through the transfer processes (e.g. one selective transfer process shown in FIG. 2B), and the yield of the method for manufacturing the light emitting device 1A and the reliability of the light emitting device 1A can be improved.

In some embodiments, the light emitting units with different colors may sequentially be transferred to the driving substrate 40A by performing the steps shown in FIGS. 2A to 2C multiple times. That is, the light emitting units with the same color may be transferred at the same time, but not limited thereto. According to different requirements, in addition to the steps shown in FIGS. 2A to 2C, the manufacturing of the light emitting device 1A may also include other additional steps. For example, a step of attaching the circuit board 400 of the driving substrate 40A to other circuits (not shown) after the required transfer processes are completed, but not limited thereto.

Figure 3A:
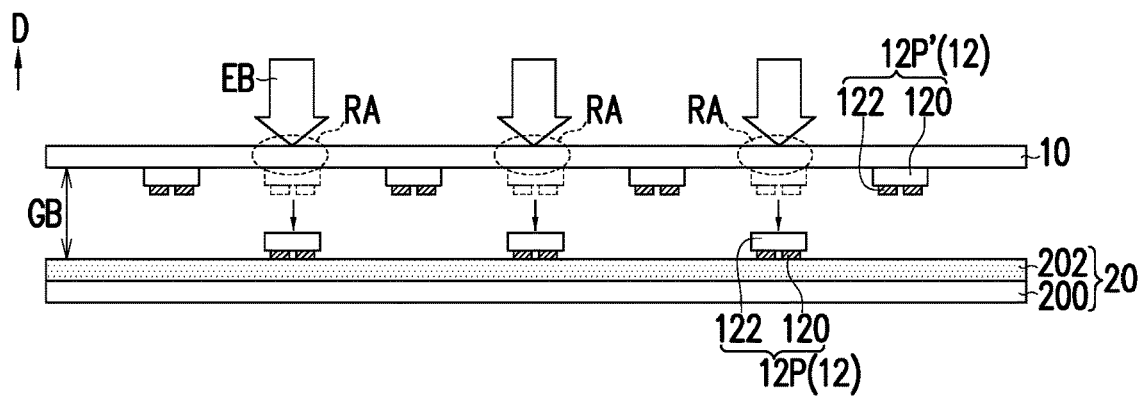
FIG. 3A to FIG. 3B are flowcharts of a method for manufacturing a light emitting device according to a third embodiment of the disclosure.
Figure 3B:
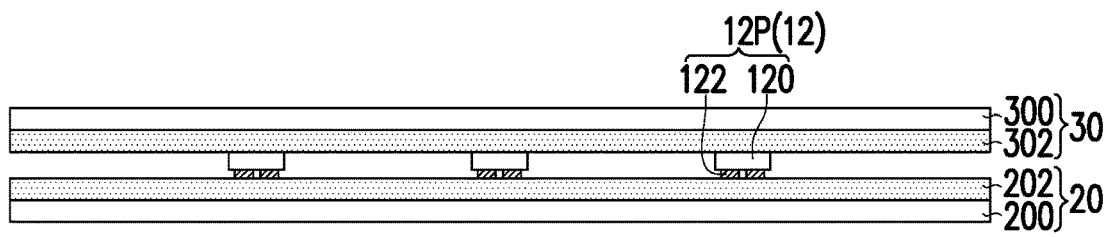

FIG. 3A to FIG. 3B are flowcharts of a method for manufacturing a light emitting device according to a third embodiment of the disclosure. Referring to FIG. 3A, the substrate 10 provided with the light emitting units 12 is located on the carrier 20, and the light emitting units 12 face the carrier 20. Then the light emitting units 12P are transferred to the carrier 20 through a selective transfer process. For example, regions RA of the substrate 10 overlapped with the light emitting units 12P in the normal direction D of the substrate 10 are illuminated by the energy beam EB, and the light emitting units 12P are separated from the substrate 10 and fall on the carrier 20. A gap GB between the substrate 10 and the carrier 20 when the substrate 10 is illuminated by the energy beam EB may be greater than 0 μm and less than or equal to 1000 μm (i.e., 0 μm<GB≤1000 μm, such as 100 μm, 200 μm, 400 μm, or 800 μm) to improve the accuracy or success rate of LED transfer. The gap GB between the substrate 10 and the carrier 20 refers to the distance between the outermost surface of the carrier 20 facing the substrate 10 and the outermost surface of the substrate 10 facing the carrier 20 along a stacking direction of the carrier 20 and the substrate 10. For the related description of the energy beam EB and the chemical reaction generated at the substrate 10 due to the irradiation of the energy beam EB, please refer to the above, and it will not be repeated here.

Referring to FIG. 3B, after the selective transfer shown in FIG. 3A, the light emitting units 12P are transferred from the carrier 20 to the carrier 30. For example, the light emitting units 12P are attached to the carrier 30, and then the carrier 20 is removed. When the light emitting units 12P are attached to the carrier 30, the light emitting units 12P may contact the adhesive layer 302 of the carrier 30.

After the light emitting units 12P are attached to the carrier 30, the carrier 20 is removed. The adhesion of the adhesive layer 302 to the light emitting units 12P shall be greater than the adhesion of the adhesive layer 202 to the light emitting units 12P, and when the carrier 20 is removed, the light emitting units 12P are still attached to the carrier 30.

Accordingly, the adhesive layer 302 of the carrier 30 has a adhesive ability or sticky higher than that of the adhesive layer 202 of the carrier 20.

After the light emitting units 12P are transferred from the carrier 20 to the carrier 30, steps shown in FIGS. 1C and 1D may be sequentially proceeded, and the light emitting device 1 in FIG. 1D is manufactured.

In the embodiment shown in FIGS. 3A and 3B, the light emitting units 12P are bonded to the driving substrate 40 through the transfer processes (e.g. one selective transfer process shown in FIG. 3A and two mass transfer process shown in FIG. 3B and FIG. 1C).

In some embodiments, the light emitting units with different colors may sequentially be transferred to the driving substrate 40 by performing the steps shown in FIGS. 3A, 3B, 1C and 1D multiple times. According to different requirements, in addition to the steps shown in FIGS. 3A, 3B, 1C and 1D, the manufacturing of the light emitting device 1 may also include other additional steps. For example, a step of attaching the circuit board 400 of the driving substrate 40 to other circuits (not shown) after the required transfer processes are completed, but not limited thereto.

Figure 4A:
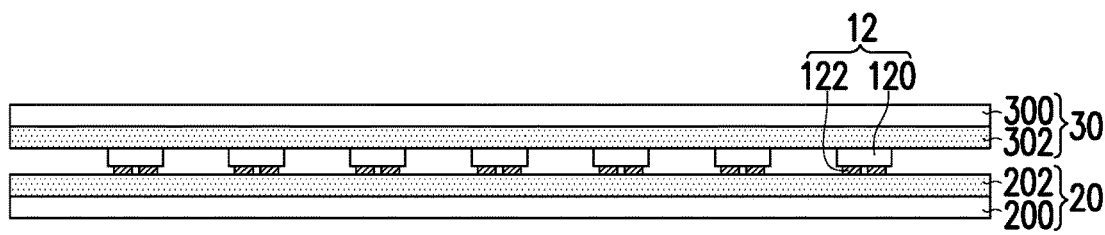
FIG. 4A to FIG. 4B are flowcharts of a method for manufacturing a light emitting device according to a fourth embodiment of the disclosure.
Figure 4B:
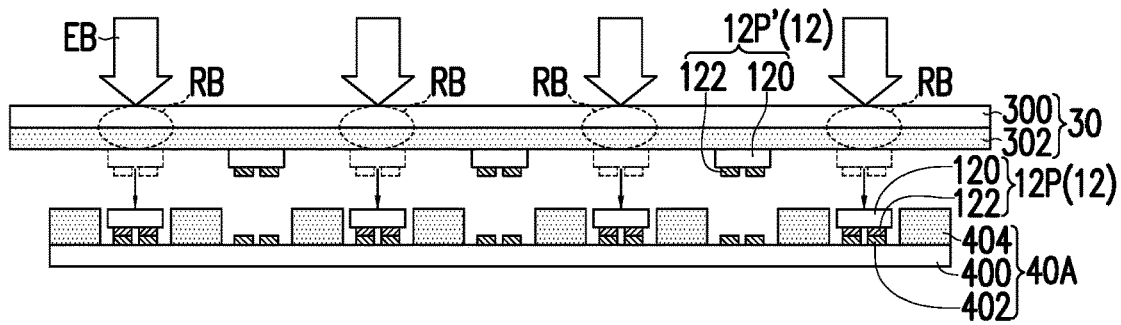

FIG. 4A to FIG. 4B are flowcharts of a method for manufacturing a light emitting device according to a fourth embodiment of the disclosure. Referring to FIG. 4A, after the light emitting units 12 are transferred from the substrate 10 to the carrier 20 as shown in FIG. 1A, the light emitting units 12 are transferred from the carrier 20 to the carrier 30. For example, the light emitting units 12 are attached to the carrier 30, and then the carrier 20 is removed. When the light emitting units 12 are attached to the carrier 30, the light emitting units 12 are attached to the adhesive layer 302 of the carrier 30.

Referring to FIG. 4B, after the light emitting units 12 are transferred from the carrier 20 to the carrier 30, the light emitting units 12P may be transferred from the carrier 30 to the driving substrate 40A by illuminating regions RB of the carrier 30 overlapped with the light emitting units 12P by the energy beam EB. For the related description of the energy beam EB and the chemical reaction generated at the adhesive layer 302 of the carrier 30 due to the irradiation of the energy beam EB, please refer to the above, and it will not be repeated here.

After the light emitting units 12 are transferred from the carrier 20 to the carrier 30, the step shown in FIG. 2C may be proceeded, and the light emitting device 1A in FIG. 2C is manufactured.

In some embodiments, the light emitting units with different colors may sequentially be transferred to the driving substrate 40A by performing the steps shown in FIGS. 1A, 4A, 4B and 2C multiple times. According to different requirements, in addition to the steps shown in FIGS. 1A, 4A, 4B and 2C, the manufacturing of the light emitting device 1A may also include other additional steps. For example, a step of attaching the circuit board 400 of the driving substrate 40A to other circuits (not shown) after the required transfer processes are completed, but not limited thereto.

Figure 5A:
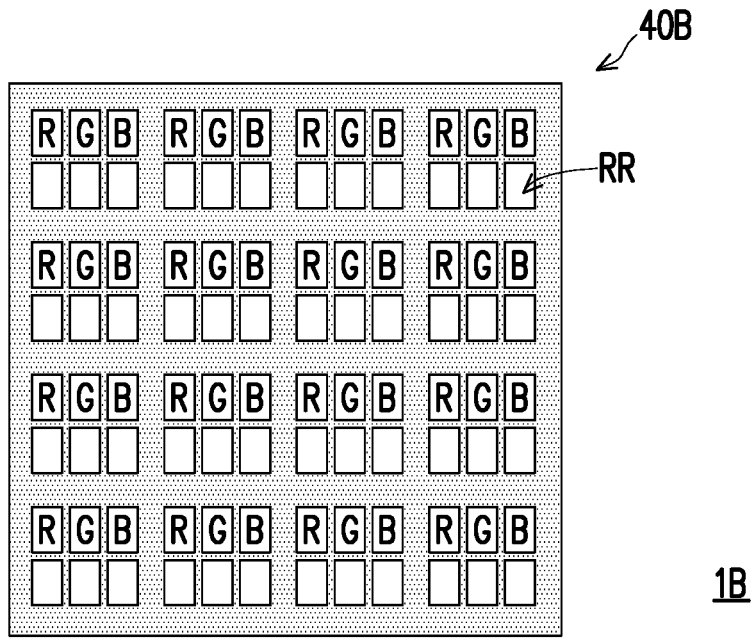
FIG. 5A and FIG. 5B are schematic top views of a light emitting device before and after repairing, respectively.
Figure 5B:
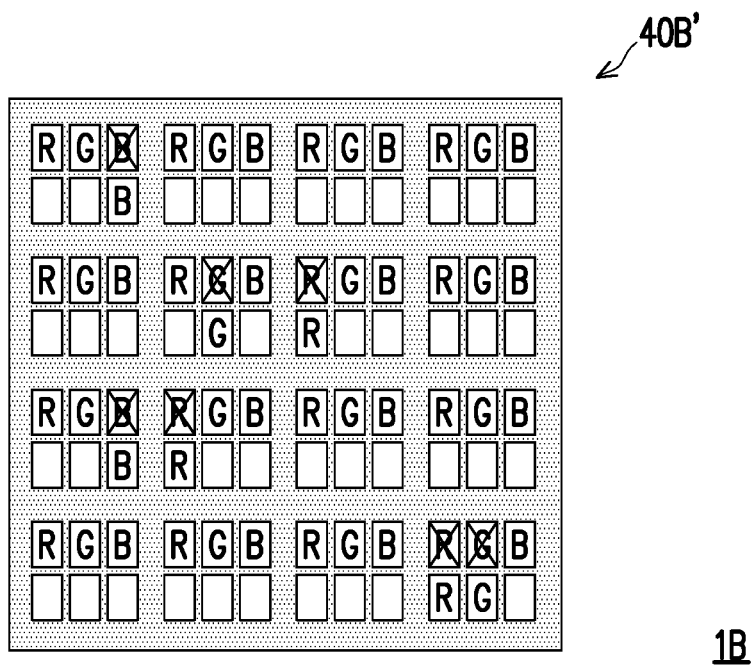

FIG. 5A and FIG. 5B are schematic top views of a light emitting device before and after repairing, respectively. FIG. 5A illustrates a driving substrate 40B of a light emitting device 1B before repairing. The light emitting device 1B includes red light emitting units R, green light emitting units G and blue light emitting units B disposed on the driving substrate 40B and arranged in an array. For repair needs, the driving substrate 40B further includes redundant regions RR disposed adjacent to the red light emitting units R, the green light emitting units G and the blue light emitting units B. When at least one of the light emitting units on the driving substrate 40B is found to be inoperable, a light emitting unit having the same color as that of the inoperable light emitting unit (the light emitting unit with x mark) may be disposed in the redundant region RR adjacent to the inoperable light emitting unit through a repair transfer process. For example, red light emitting units R may be transferred to redundant regions RR adjacent to the inoperable red light emitting units R through one of the transfer processes described above. Then, green light emitting units G may be transferred to redundant regions RR adjacent to the inoperable green light emitting units G through one of the transfer processes described above. Then, blue light emitting units B may be transferred to redundant regions RR adjacent to the inoperable blue light emitting units B through one of the transfer processes described above.

In summary, in one or more embodiments of the disclosure, the method for manufacturing the light emitting device describes light emitting unit transfer technology and is suitable for the mass transfer, the selective transfer, or the repair transfer. In some embodiments, the light emitting units may be detached from a substrate or a carrier through a light illumination process (e.g., a laser lift off process). In some embodiments, the selective transfer may be performed by illuminating the regions of the substrate or the carrier that are overlapped with the light emitting units to be detached from the substrate or the carrier by the energy beam of the light illumination process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents. Moreover, each of the claims constitutes an individual embodiment, and the scope of the disclosure also includes the scope of the various claims and combinations of the embodiments.

What is claimed is:

1. A method for manufacturing a light emitting device, comprising:
    providing a substrate with light emitting units disposed thereon;
    attaching the light emitting units to a carrier;
    removing the substrate; and
    transferring a portion of the light emitting units from the carrier to a driving substrate, wherein transferring the portion of the light emitting units from the carrier to the driving substrate comprises:
    transferring the portion of the light emitting units from the carrier to another carrier, which comprises illuminating regions of the carrier overlapped with the portion of the light emitting units by an energy beam, wherein the other portion of the light emitting units is not transferred from the carrier to the another carrier; and
    transferring the portion of the light emitting units from the another carrier to the driving substrate,
    wherein a gap between the carrier and the another carrier when the carrier is illuminated by the energy beam is in a range from 1 μm to 300 μm, and the gap between the carrier and the another carrier is a distance between an outermost surface of the carrier facing the another carrier and an outermost surface of the another carrier facing the carrier along a stacking direction of the carrier and the another carrier.

2. The method for manufacturing the light emitting device according to claim 1, wherein a wavelength of the energy beam is in a range from 266 nm to 1064 nm.

3. The method for manufacturing the light emitting device according to claim 1, wherein the another carrier comprises:
   a rigid substrate; and
   an adhesive layer disposed on the rigid substrate, wherein the portion of the light emitting units are disposed on the adhesive layer after the portion of the light emitting units are transferred from the carrier to the another carrier.

4. The method for manufacturing the light emitting device according to claim 1, wherein transferring the portion of the light emitting units from the another carrier to the driving substrate comprises:
   bonding pads of the portion of the light emitting units to pads of the driving substrate; and
   removing the another carrier.

5. The method for manufacturing the light emitting device according to claim 4, wherein removing the another carrier comprises illuminating the another carrier by an energy beam.

6. The method for manufacturing the light emitting device according to claim 1, wherein transferring the portion of the light emitting units from the carrier to the driving substrate comprises:
   transferring the light emitting units from the carrier to another carrier; and
   transferring the portion of the light emitting units from the another carrier to the driving substrate.

7. The method for manufacturing the light emitting device according to claim 6, wherein each of the carrier and the another carrier comprises:
   a rigid substrate; and
   an adhesive layer disposed on the rigid substrate, wherein the adhesive layer of the another carrier has a viscosity higher than that of the adhesive layer of the carrier, the light emitting units are attached to the adhesive layer of the another carrier when transferring the light emitting units from the carrier to the another carrier, and the light emitting units are disposed on the adhesive layer of the another carrier after the light emitting units are transferred from the carrier to the another carrier.

8. The method for manufacturing the light emitting device according to claim 6, wherein transferring the portion of the light emitting units from the another carrier to the driving substrate comprises illuminating regions of the another carrier overlapped with the portion of the light emitting units by an energy beam.

9. The method for manufacturing the light emitting device according to claim 8, wherein transferring the portion of the light emitting units from the another carrier to the driving substrate further comprises bonding the portion of the light emitting units to the driving substrate by an eutectic bonding or a reflow process.

10. The method for manufacturing the light emitting device according to claim 6, wherein the driving substrate comprises:
    a circuit board;
    pads disposed on the circuit board, wherein pads of the portion of the light emitting units are bonded to the pads of the driving substrate after the portion of the light emitting units are transferred from the another carrier to the driving substrate; and
    a pixel defining layer disposed on the circuit board and comprising holes accommodating the portion of the light emitting units.

11. The method for manufacturing the light emitting device according to claim 10, wherein a material of the pixel defining layer comprises an opaque insulating material.

12. The method for manufacturing the light emitting device according to claim 1, wherein attaching the light emitting units to the carrier is performed with a lamination pressure in a range from 0.1M Pa to 3M Pa.

13. The method for manufacturing the light emitting device according to claim 1, wherein attaching the light emitting units to the carrier is performed with a lamination temperature in a range from room temperature to 300° C.

14. The method for manufacturing the light emitting device according to claim 1, wherein the substrate is a growth substrate.

15. The method for manufacturing the light emitting device according to claim 1, wherein the carrier comprises:
    a rigid substrate; and
    an adhesive layer disposed on the rigid substrate, wherein the light emitting units are attached to the adhesive layer after attaching the light emitting units to the carrier.

16. The method for manufacturing the light emitting device according to claim 15, wherein a thickness of the adhesive layer is in a range from 0.1 μm to 100 μm.

17. The method for manufacturing the light emitting device according to claim 1, wherein removing the substrate comprises illuminating the substrate by an energy beam.

* * * * *